(12) United States Patent
Okui et al.

(10) Patent No.: US 6,702,892 B2
(45) Date of Patent: Mar. 9, 2004

(54) PRODUCTION DEVICE FOR HIGH-QUALITY SILICON SINGLE CRYSTALS

(75) Inventors: Masahiko Okui, Osaka (JP); Manabu Nishimoto, Saga (JP); Takayuki Kubo, Saga (JP); Fumio Kawahigashi, Saga (JP); Hiroshi Asano, Saga (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 94 days.

(21) Appl. No.: 09/926,285

(22) PCT Filed: Feb. 8, 2001

(86) PCT No.: PCT/JP01/00901

§ 371 (c)(1),
(2), (4) Date: Nov. 20, 2001

(87) PCT Pub. No.: WO01/59187

PCT Pub. Date: Aug. 16, 2001

(65) Prior Publication Data

US 2002/0139298 A1 Oct. 3, 2002

(30) Foreign Application Priority Data

Feb. 8, 2000 (JP) .......................................... 2000-30558

(51) Int. Cl.[7] .............................................. C30B 15/14
(52) U.S. Cl. ............................. 117/214; 117/13; 117/33; 117/215; 117/217
(58) Field of Search ......................... 117/13, 33, 217, 117/214, 215

(56) References Cited

U.S. PATENT DOCUMENTS

| | | | |
|---|---|---|---|
| 4,981,549 A | * 1/1991 | Yamashita et al. | ......... 117/217 |
| 5,268,061 A | * 12/1993 | Sunwoo et al. | ............. 117/217 |
| 5,363,796 A | * 11/1994 | Kobayashi et al. | ......... 117/217 |
| 5,567,399 A | * 10/1996 | Von Ammon et al. | ...... 117/217 |
| 5,824,149 A | * 10/1998 | Li | ............................. 117/217 |
| 6,117,402 A | * 9/2000 | Kotooka et al. | ............ 117/217 |

FOREIGN PATENT DOCUMENTS

| | | |
|---|---|---|
| EP | 0591525 A1 | 4/1994 |
| JP | 8-002993 | 1/1996 |
| JP | 8-330316 | 12/1996 |
| JP | 11-43396 | 2/1999 |
| JP | 11-79889 | 3/1999 |
| JP | 11-92272 | 4/1999 |

* cited by examiner

Primary Examiner—Robert Kunemund
(74) Attorney, Agent, or Firm—Westerman, Hattori, Daniels & Adrian, LLP (57) ABSTRACT

An apparatus is provided which is to be used in producing single crystals for silicon wafers useful as semiconductor materials and which can stably produce large-diameter, long-length and high-quality single crystals from which wafers limited in the number of grown-in defects can be taken. This silicon single crystal production apparatus comprises a cooling member surrounding the single crystal to be pulled up and having an internal surface coaxial with the pulling axis and thermal insulating members disposed outside the outer surface and below the bottom surface of the cooling member, the cooling member having an internal surface diameter of 1.20D to 2.50D (D being the diameter of the single crystal to be pulled up) and a length of not less than 0.25D, the distance from the melt surface to the bottom surface of the cooling member being 0.30D to 0.85D and the bottom side of the thermal insulating member below the cooling member having an inside diameter smaller than the inside diameter of the bottom of the cooling member.

4 Claims, 6 Drawing Sheets

Single crystal
Isotherm
Molten liquid surface

Single crystal diameter

Single crystal diameter $G_C < G_S$ $G_C \geqq G_S$

PRODUCTION DEVICE FOR HIGH-QUALITY SILICON SINGLE CRYSTALS

TECHNICAL FIELD

This invention relates to an apparatus for producing silicon single crystals for use as semiconducting material silicon wafers. More particularly, it relates to an apparatus by which high-quality, large-diameter, long-length silicon single crystals capable of giving wafers while reducing the occurrence of grown-in defects such as dislocation clusters and laser scattering tomography defects as far as possible can be produced and grown stably by the Czochralksi method (hereinafter referred to as "CZ method").

BACKGROUND ART

The CZ method for pulling up and growing silicon single crystals is a method most widely used in the production of silicon single crystals for use in preparing semiconducting material silicon wafers.

The CZ method comprises dipping a seed crystal in molten silicon placed in a quartz crucible and pulling up the seed crystal to thereby allow a single crystal to grow. With the advancement in the technology of pulling up and growing silicon single crystals, it has now become possible to produce less defective, dislocation-free, large single crystals. Semiconductor devices are produced from wafers or substrates prepared from single crystals via several hundred processes. In the course thereof, the substrates are subjected to a large number of physical treatments, chemical treatments and, further, thermal treatments, including treatments in a severe thermal environment, such as high temperature treatments at 1,000° C. or above. Thus, problems are produced by microdefects, in particular grown-in defects, the causative factors of which have been introduced into single crystals in the process of their growth and which manifest themselves in some or other device production process and deteriorate the performance characteristics of the devices.

Figure 1:
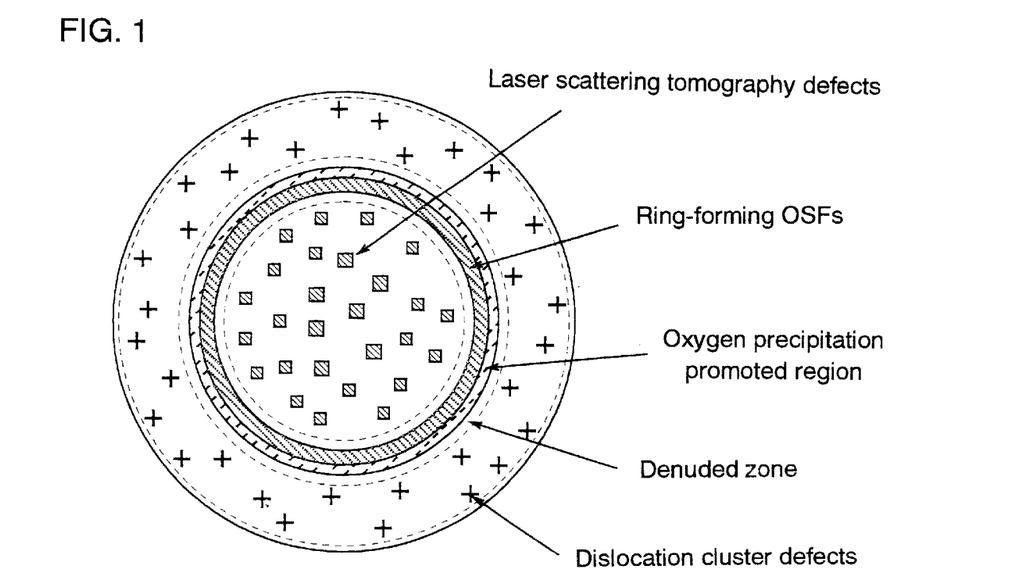
FIG. 1 is a figure schematically illustrating a typical example of the distribution of defects as observed on a silicon wafer.

The distribution of typical ones among these microdefects is observed, for example, as shown in FIG. 1. This is a schematic representation of the result of an observation of the distribution of microdefects, by X-ray topography, on a wafer sliced from a single crystal after growing, immersed in an aqueous solution of copper nitrate for deposition of copper and then subjected to heat treatment. This wafer shows, at a position about ½ of the outside diameter, oxidation-induced stacking faults (hereinafter referred to as "OSFs"). Inside this ring, there are found laser scattering tomography defects (also called "COPs" or "FPDs", all being defects of the same kind resulting from deficiency of Si). Adjacent to and just outside the ring-forming OSFs, there is an oxygen precipitation promoted region, where oxide precipitates tend to appear. Further outside, in the peripheral region of the wafer, there occur dislocation clusters. These laser scattering tomography defects and dislocation clusters are called grown-in defects.

Figure 2:
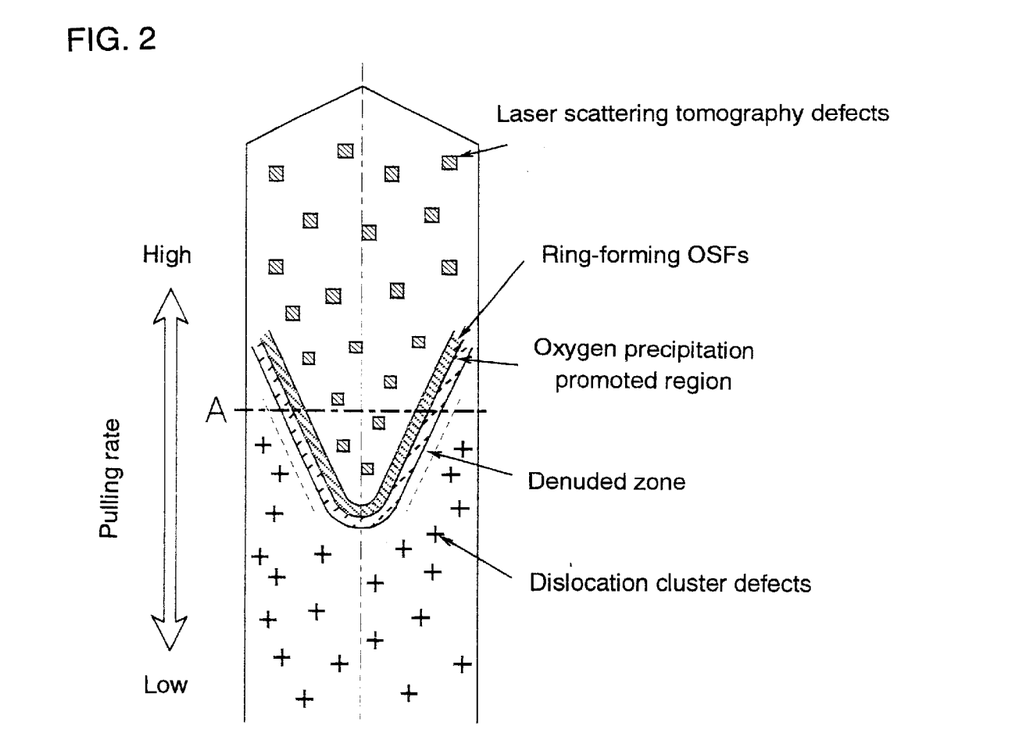
FIG. 2 is a figure schematically illustrating the general relation between the pulling rate in the step of pulling up a single crystal and the sites of occurrence of crystal defects.

The sites of occurrence of the above defects are greatly influenced by the pulling rate on the occasion of single crystal growth. When a single crystal is grown while varying the pulling rate within the pulling rate range in which sound crystals can be obtained and when they are examined for the distributions of various defects in a plane cut longitudinally along the crystal center pulling axis, the results obtainable are as shown in FIG. 2. As for the surfaces of disk-like wafers sliced perpendicularly to the pulling axis, an OSF ring first appears from the wafer periphery as the pulling rate decreases after shoulder formation and attaining of a desired single crystal diameter. The diameter of such OSF ring gradually decreases with the decrease in pulling rate and soon disappears, whereupon the whole wafer surface becomes one corresponding to the region outside the OSF ring. Thus, FIG. 1 shows the sectional view at position A of the single crystal shown in FIG. 2, or the wafer surface from the single crystal grown at the pulling rate at that time. If the site of occurrence of the OSF ring is taken as a criterion, a higher pulling rate gives a high growth rate single crystal corresponding to the region inside the OSF ring and a slower pulling rate gives a low growth rate single crystal corresponding to the outside region.

It is well known that dislocations generated during single crystal growth and remaining in the wafer cause deteriorations in characteristics of devices formed thereon. OSFs increase the leak current and deteriorate other electric characteristics and the OSF ring is a result of high density occurrence of OSFs. Therefore, for use in ordinary LSI devices, the single crystal is grown at a relatively high pulling rate so that the ring-forming OSFs may be distributed on the outermost periphery of wafers or further outside the same. By doing so, the wafers can mostly consist of the region inside the OSF ring, namely a high growth rate single crystal, to thereby avoid dislocation clusters. This region inside the OSF ring is sometimes higher in gettering effect against heavy metal contamination which may occur more often in the process of device production as compared with the outside region.

With the recent increase in the degree of integration of LSI devices, the gate oxide films have become thinner and the treatment temperatures in the process of device production have become lower. Therefore, the occurrence of OSFs decreases and, owing to the decrease in oxygen content of crystals, ring-forming OSFs and other OSFs have been less problematized as factors deteriorating device characteristics. It has been revealed, however, that the occurrence of laser scattering tomography defects, which tend to be generated in high growth rate single crystals, greatly deteriorate the dielectric breakdown strength of gate oxide films, which are now thin. In particular when device patterns become finer, their influence is known to increase, making it difficult to increase the degree of integration.

Referring to the distribution of defects in the wafer shown in FIG. 1, there is a region, outside the OSF ring, in which dislocation clusters tend to occur. Between this OSF ring and the dislocation cluster occurrence region, there is a region adjacent to and just outside the OSF ring where oxide precipitation tends to occur, namely an oxygen precipitation promoted region, and, outside that region, there is a denuded zone where no dislocation clusters are detected. Inside the OSF ring, adjacent to the ring, there is also a narrow denuded zone where no laser scattering tomography defects can be detected.

If the denuded zone can be enlarged, there arises the possibility of wafers or single crystals very small in the number of defects being obtained. For example, Japanese Patent Application Laid-Open (Kokai) No. 08-330316 (1996) proposes a method of expanding only the denuded zone outside the OSF ring into the whole in-plane area of a single crystal without causing dislocation clusters to occur by controlling the temperature gradient within the crystal so that the value V/G (where V is the pulling rate (mm/min) during single crystal growth and G is the temperature gradient (° C./mm) within the crystal in the pulling axis direction in the temperature range between the melting point to 1,300° C.) may amount to 0.20 to 0.22 in the domain from the crystal center toward a position 30 mm from the periphery and, from that position toward the periphery, it may gradually increase.

In this case, it is indicated that the positions of the crucible and heater, the position of the semiconical thermal radiator made of carbon and disposed around the growing single crystal, the structure of the thermal insulator around the heater and other various conditions should be examined by global heat transfer calculations so that the above temperature conditions may be selected for the crystal growth.

Further, Japanese Patent Application Laid-Open No. 11-79889 (1999) discloses an invention concerning a production method which comprises pulling a single crystal in a manner such that the solid-liquid interface during the growth thereof may have a shape within ±5 mm relative to the mean position of the solid-liquid interface except for the 5-mm-wide region around the single crystal while controlling the temperature inside of the furnace so that the difference $\Delta G$ ($=Ge-Gc$) between two temperature gradients, namely the temperature gradient Gc within the crystal in the pulling axis direction in the crystal center portion and the temperature gradient Ge in the crystal periphery portion within the range of 1,420° C. to 1,350° C. or of the melting point to 1,400° C., may amount to not more than 5° C./cm. To sum up, this is a production method consisting in maintaining the solid-liquid interface as flatly as possible and maintaining the temperature gradient from the solid-liquid interface to the inside of the single crystal as uniformly as possible.

It is alleged that by growing single crystals under such conditions and further applying a horizontal magnetic field not less than 0.2T to the melt, it is possible to readily obtain single crystals having a minimized number of grown-in defects. However, it seems that the concrete means for realizing the above condition around the crystal just after solidification, namely the means for producing the effects of the above invention, such as the means for maintaining the solid-liquid interface within ±5 mm and the means for maintaining $\Delta G$ at 5° C./mm or less, consist only in providing a heat insulator near the solid-liquid interface of the crystal immediately above the liquid surface of the silicon melt at a distance of 3 to 5 cm above the liquid surface so that it may surround the silicon single crystal.

The above invention is based on an estimation and investigation of the state of temperature distribution during single crystal growth by means of global heat transfer analysis software. Such software, however, can estimate the temperature distribution under certain given conditions but cannot provide specific control conditions for realizing a specific temperature distribution condition around a single crystal.

Some methods have been proposed for reducing laser scattering tomography defects by modifying in various ways the cooling process immediately after pulling up of single crystals. For example, Japanese Patent Application Laid-Open No. 08-2993 (1996) discloses an invention concerning a method comprising making the time of passage through a high temperature region from the melting point to 1,200° C. not less than 200 minutes and the time of passage through a temperature region from 1,200° C. to 1,000° C. not longer than 150 minutes. Japanese Patent Application Laid-Open No. 11-43396 (1999) proposes an invention relating to a method comprising disposing a cooling member near the melt surface in a manner such that it surrounds a silicon single crystal, once cooling the single crystal just after pulling up at a cooling gradient of not less than 2° C./mm, then heating the same prior to its temperature becoming 1,150° C. or below and maintaining the same at a temperature of not lower than 1,200° C. for several hours or longer, as well as an apparatus therefor.

However, it seems not easy to markedly reduce the number of laser scattering tomography defects in question all over the respective wafer surfaces perpendicular to the single crystal pulling axis by merely rapidly cooling the single crystal and maintaining the same at high temperatures within the temperature range from the melting point just after pulling up and about 1,200° C.

In a wafer such as shown in FIG. 1, neither laser scattering tomography defects nor dislocation cluster defects are found in the ring-forming OSF region and oxygen precipitation promoted region. As mentioned hereinabove, the problem of adverse effects of OSFs and oxide precipitation have been alleviated, hence the occurrence of ring-forming OSFs is now not so severe as before, owing to the lowering temperature in device production steps and the resulting reducing oxygen concentration in crystals.

Accordingly, if this denuded zone and OSF ring plus the oxygen precipitation promoted region can be enlarged, single crystals, or wafers, free of both kinds of grown-in defect must be obtained, since neither laser scattering tomography defects nor dislocation clusters are found in these regions. Thus, it is estimable that single crystals with such grown-in defect-free region enlarged all over the sectional area might be obtained by selecting the pulling rate and enlarging, if possible to a horizontal state, the salient angle opening toward the above and illustrating the V-shaped distribution of ring-forming OSFs depending on the pulling rate as shown in FIG. 2.

Therefore, the reason why the regions where laser scattering tomography defects or dislocation cluster defects occur are generated or the V-shaped distribution of ring-forming OSFs is caused, as shown in FIG. 2, is now discussed.

When, in the step of pulling up for single crystal growth, the melt solidifies and changes into a solid crystal, the liquid phase in which atoms are arranged randomly changes into the solid phase in which atoms are positioned regularly and, therefore, the solid phase portion near the solid-liquid interface contains a large number of vacancies, which are sites of lacking of due atoms, and interstitial atoms, which are extra silicon atoms having entered the space outside the crystal lattice of atoms. It is presumable that vacancies lacking in atoms are by far abundant in the crystal just after solidification than interstitial atoms. As the portion that has solidified and become a single crystal goes away from the solid-liquid interface as a result of pulling, vacancies and interstitial atoms disappear by migration, diffusion, recombination and so on, giving a regular atomic arrangement. As it is further pulled up and its temperature lowers, the rate of migration or diffusion decreases and a certain number of vacancies and interstitial atoms remain.

Those vacancies and interstitial atoms which have been taken up during the process of solidification can move within the crystal fairly freely and the rate of migration or diffusion of vacancies is generally higher than that of interstitial atoms. And, as mentioned above, the number of vacancies just after solidification is larger than that of interstitial atoms. The equilibrium concentrations of vacancies and interstitial atoms which can occur within the crystal at high temperatures decrease as the temperature decreases. Thus, even when vacancies and interstitial atoms are present in the same amount, lower temperature species are higher in substantial concentration, namely chemical potential, and higher temperature species are lower in concentration.

Figure 3:
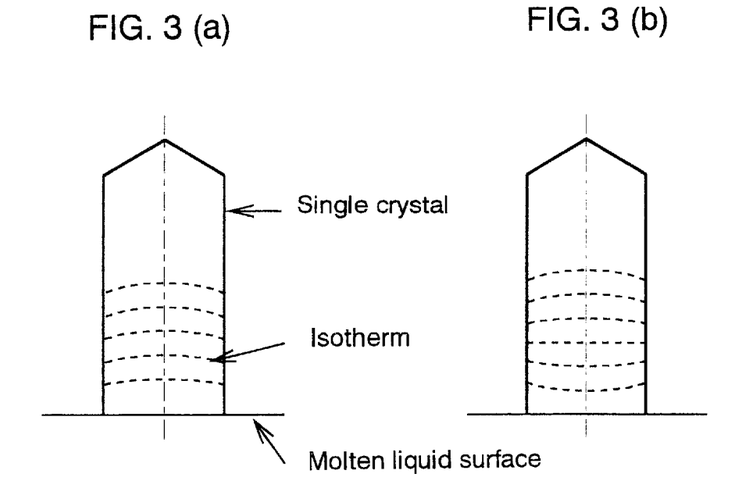
FIGS. 3a and 3b are figures schematically showing the temperature distribution within a single crystal in the step of pulling up the single crystal.

A single crystal during growing shows a temperature gradient in the vertical direction. Since, generally, heat is dissipated from the surface, the temperature distribution is such that the crystal periphery region has a lower temperature as compared with the central portion, as schematically shown in FIG. 3(a). When this is considered in terms of the temperature difference between two positions separated by a certain distance in the vertical direction, namely the temperature gradient in the vertical direction, the temperature gradient (Gc) in the central portion of the single crystal is smaller than the temperature gradient (Gs) in the peripheral region. If the structure of the hot zone, namely the cooled periphery of the single crystal during pulling, remains the same, the above condition of the temperature gradient in the vertical pulling axis direction will change little even when the pulling rate changes to some extent.

Since this temperature difference or temperature gradient within the crystal causes a substantial difference in concentration between vacancies and interstitial atoms, as mentioned above, it is presumable that the diffusion of vacancies and/or interstitial atoms occurs which is contrary to the temperature lowering, namely from the lower temperature side to the higher temperature side, from the upper portion of the growing single crystal to the solid-liquid interface. This diffusion in the direction reverse to the temperature lowering is hereinafter referred to as "up-hill diffusion".

Since vacancies and interstitial atoms disappear when they arrive at the crystal surface, their concentration in the vicinity of the surface is lower and their diffusion in the direction toward the surface occurs in addition to the up-hill diffusion. Therefore, when seen on a plane corresponding to a wafer perpendicular to the pulling axis, the concentration of vacancies and interstitial atoms is higher in the central portion of the single crystal while they show a lower distribution in the peripheral region. Further, the following phenomenon occurs simultaneously; since a vacancy is a site lacking in a crystal lattice-constituting atom and an interstitial atom is an extra atom, these two, when they collide with each other, recombine with each other and thus disappear with a certain probability, leaving a complete crystal lattice. Such diffusion of vacancies and interstitial atoms and their recombination and annihilation proceed most actively within the temperature range of from the melting point (1,412° C.) to about 1,250° C. and the rates thereof become slow at temperatures below that range.

Figure 4:
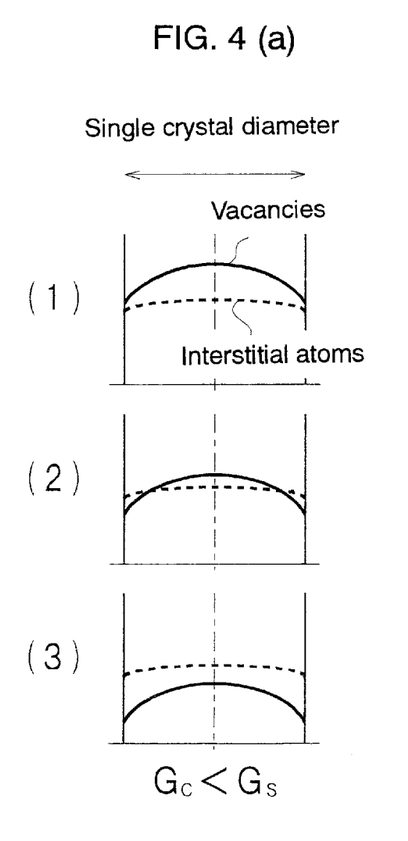
FIGS. 4a and 4b include conceptual figures illustrating the differences in concentration of vacancies or interstitial atoms as resulting from the differences in the temperature gradient along the pulling axis direction between the central portion and surface portion of a single crystal.

As discussed above, the concentration distribution of vacancies and of interstitial atoms on a wafer-corresponding plane under high temperature conditions during single crystal pulling is presumably as schematically shown in FIG. 4(a). Under ordinary growing conditions, the concentration of vacancies and of interstitial atoms shows a distribution such that it decreases as the site approaches the surface, owing to the up-hill diffusion and the diffusion toward the crystal surface, as mentioned above. However, since the rate of diffusion of vacancies is higher, the concentration distribution thereof is greater in curvature than that of interstitial atoms. Immediately after solidification, vacancies are more abundant than interstitial atoms, so that their concentration distributions on a wafer-corresponding plane are such that vacancies predominate all over the plane, as shown in FIG. 4(a)-(1), when the growth rate is relatively rapid. When cooling proceeds in that state, vacancies are left in excess as compared with interstitial atoms while the temperature lowers. Although the annihilation thereof may proceed to some extent due to diffusion to the surface or recombination, the remaining vacancies leave traces thereof, causing occurrence of laser scattering tomography defects. Thus, this corresponds to the high growth rate single crystal portion containing laser scattering tomography defects as shown in FIG. 2.

When, on the other hand, the growth rate is relatively slow, the crystal is maintained for a long period of time in such a state that the up-hill diffusion and the diffusion to the surface occur actively, so that vacancies diffuse and disappear more rapidly than they recombine with interstitial atoms and the number of vacancies decreases all over the plane in question, as shown in FIG. 4(a)-(3); when the temperature arrives at a level at which the diffusion becomes sluggish or inactive, excessive interstitial atoms remain and the whole wafer-corresponding plane becomes a low growth rate single crystal portion where dislocation cluster defects are present, as shown in FIG. 2.

At a pulling rate intermediate between the above two cases, the temperature lowers in such a condition that the vacancy concentration is close to the interstitial atom concentration. Since, however, the respective concentration distributions differ in shape, a condition is produced such that vacancies occur in excess relative to interstitial atoms in the central portion of the crystal and vacancies are insufficient in number in the portion close to the single crystal surface, as shown in FIG. 4(a)-(2). If cooling progresses in such a condition, the result will be that laser scattering tomography defects are distributed mainly in the central portion, as shown in FIG. 1, and dislocation cluster defects mainly in the vicinity of the outer surface. In that intermediate region between the peripheral region and central portion in which vacancies balance with interstitial atoms, these two species recombine with each other and disappear with the progress of cooling, so that there is formed a region free of those grown-in defects which occur in the high growth rate single crystal portion or low growth rate single crystal portion.

An OSF ring appears almost in the same place as the region free of both the above defects. The OSF ring, the oxygen precipitation promoted region adjacent thereto and the further outer denuded zone are free of such grown-in defects as laser scattering tomography defects or dislocation clusters. While it is said that the formation of OSFs is caused by oxide precipitates serving as nuclei, the reason why oxide precipitate nuclei are formed in this position is not clear. However, OSFs are presumably formed in the region in which vacancies occur in slight excess as compared with the region where vacancies and interstitial atoms balance against each other species by the interaction therebetween and in which oxygen atom precipitation readily occurs. The fact that the OSF ring, the oxygen precipitation promoted region adjacent thereto and further the denuded zone approach the outermost wafer periphery when the pulling rate is high and the regions and zone approach the central portion when it is slow can also be regarded as suggestive of the occurrence of a region where the concentration of vacancies balances against the concentration of interstitial atoms.

DISCLOSURE OF THE INVENTION

If a region free of either of two grown-in defects, namely laser scattering tomography defects and dislocation clusters results from balancing between the concentration of vacancies and that of interstitial atoms, it must be possible to obtain single crystals free of either laser scattering tomography defects or dislocation cluster defects by making the concentration distributions of vacancies and interstitial atoms almost equal to each other all over the wafer-corresponding planes. For that purpose, it is considered enough to make the concentration distribution of vacancies, which are relatively high in rate of diffusion, close to the concentration distribution of interstitial atoms, which are slow in rate of diffusion, as shown in FIG. 4(b), and further select an appropriate pulling rate. Thus, for reducing the curvature of the vacancy concentration distribution, as shown in FIG. 4(b), it is only required that the vacancy concentration in the peripheral region be prevented from decreasing as compared with the central portion.

The diffusion of vacancies and interstitial atoms toward the crystal surface cannot be avoided but the up-hill diffusion can be decreased by reducing the temperature difference. For this purpose, it seems sufficient to bring about a condition in which the temperature is higher in the peripheral region than in the central portion, or the vertical direction temperature gradient in the peripheral region is small, in that high temperature range just after solidification in which the diffusion and migration proceed actively.

Therefore, for realizing such temperature distributions, the inventors investigated various methods of cooling just after pulling up. As a result, it was found that the intended temperature distributions can be realized by causing that portion of outside surface of the single crystal which rises up from the melt to receive radiation from the crucible wall surface or melt surface and cooling the portion higher than the above-mentioned portion by means of a cooling member disposed close thereto.

Figure 5:
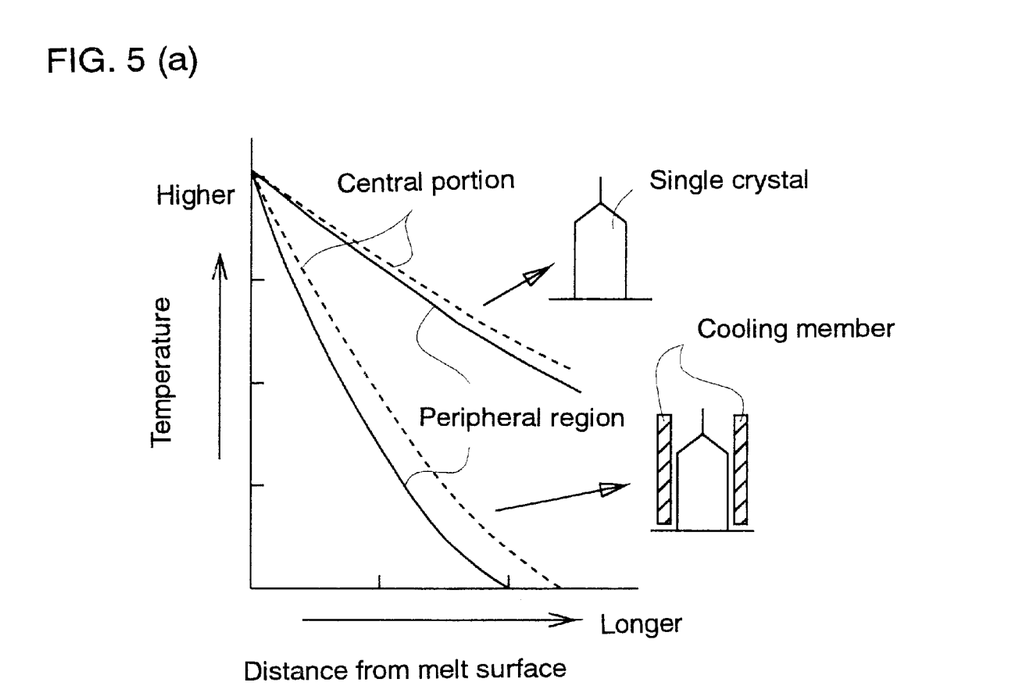
FIGS. 5a and 5b include figures illustrating the changes in temperature in the central portion and peripheral region in the single crystal pulling up step as functions of the distance from the melt surface.

In FIG. 5, there are shown the changes in temperature in the vertical direction in the central portion or the peripheral region of a single crystal during pulling up. FIG. 5(a) shows the temperature changes in the conventional method of pulling up or a method of increasing the pulling rate by disposing a cylindrical cooling member in the vicinity of the single crystal. In the cases shown in FIG. 5(a), the temperature in the peripheral region of the single crystal is always lower as compared with the central portion.

On the contrary, by disposing a cooling member at a certain distance from the melt surface and covering the bottom side and outer side thereof each with a thermal insulating member, it has become possible to cause the single crystal just after pulling up to show a higher temperature in the peripheral region than in the central portion and thus realize such temperature distributions as shown in FIG. 5(b). In this case, the surface of that portion of the single crystal in the step of being pulled up which lies between the bottom of the cooling member and the melt is warmed by radiation from the melt surface and crucible wall and the cooling thereof is slowed down. Since, however, the inside of this portion whose surface cooling is slowed down is cooled by thermal conduction from the portion just above the same which is cooled by means of the cooling member, the temperature of that inside supposedly lowers in a relative manner to give such temperature distributions.

It is important here to cover the bottom side and outside of the cooling member each with a thermal insulating member so that the melt surface and crucible inside wall surface, among others, may not be unnecessarily deprived of heat as a result of insertion of the cooling member. As a result of pulling up single crystals in such a condition, single crystals free of grown-in defects all over could be obtained by selecting an appropriate pulling rate.

It was thus found that such temperature distributions as shown above in FIG. 3(b) or FIG. 5(b) can be realized by combining a cooling member with thermal insulating members. However, it is necessary that due consideration be paid to the temperature range in which such temperature distribution is caused to appear. If the cooling member is too close to the melt surface, the temperature difference between the central portion and peripheral region of the single crystal will be too small even when the above temperature distributions can be obtained, with the result that the allowance for the pulling rate rendering wafer-corresponding planes wholly free of grown-in defects becomes too narrow, hence it becomes impossible to pull up defect-free single crystals. If, conversely, the cooling member is too distant from the melt surface or single crystal, defect-free regions cannot be sufficiently large unless the pulling rate is slowed down with reductions in productivity.

Further investigations were made concerning the structure of an apparatus capable of readily realizing such a condition as mentioned above, namely a condition in which the temperature is higher in the peripheral region then in the central portion at a level of the single crystal just after solidification in the step of pulling up which is near the melt and in which the temperature gradient in the vertical direction is smaller in the peripheral region than in the central portion and, further, concerning the structure of an apparatus enabling pulling up at a sufficiently high rate. As a result, it was found that when the diameter of the single crystal to be grown is varied, it is necessary to vary the distance from the single crystal surface to the cooling member surface, the length of the cooling member and the distance from the melt surface to the bottom face of the cooling member. Based on these findings and as a result of further establishment of the limits of various dimensions of the members of the apparatus, the present invention has now been completed.

The invention provides an apparatus for producing silicon single crystals by pulling up the same from the melt which comprises a cooling member surrounding the single crystal and having an internal surface coaxial with the pulling axis and thermal insulating members disposed outside the outer surface and below the bottom surface of the cooling member. The apparatus is characterized in that the cooling member has an internal surface diameter of 1.20D to 2.50D (D being the diameter of the single crystal to be pulled up) and a length of not less than 0.25D, that the distance from the melt surface to the bottom surface of the cooling member is 0.30D to 0.85D and that the bottom side of the thermal insulating member below the cooling member has an inside diameter smaller than the inside diameter of the bottom of the cooling member.

BEST MODES FOR CARRYING OUT THE INVENTION

Figure 6:
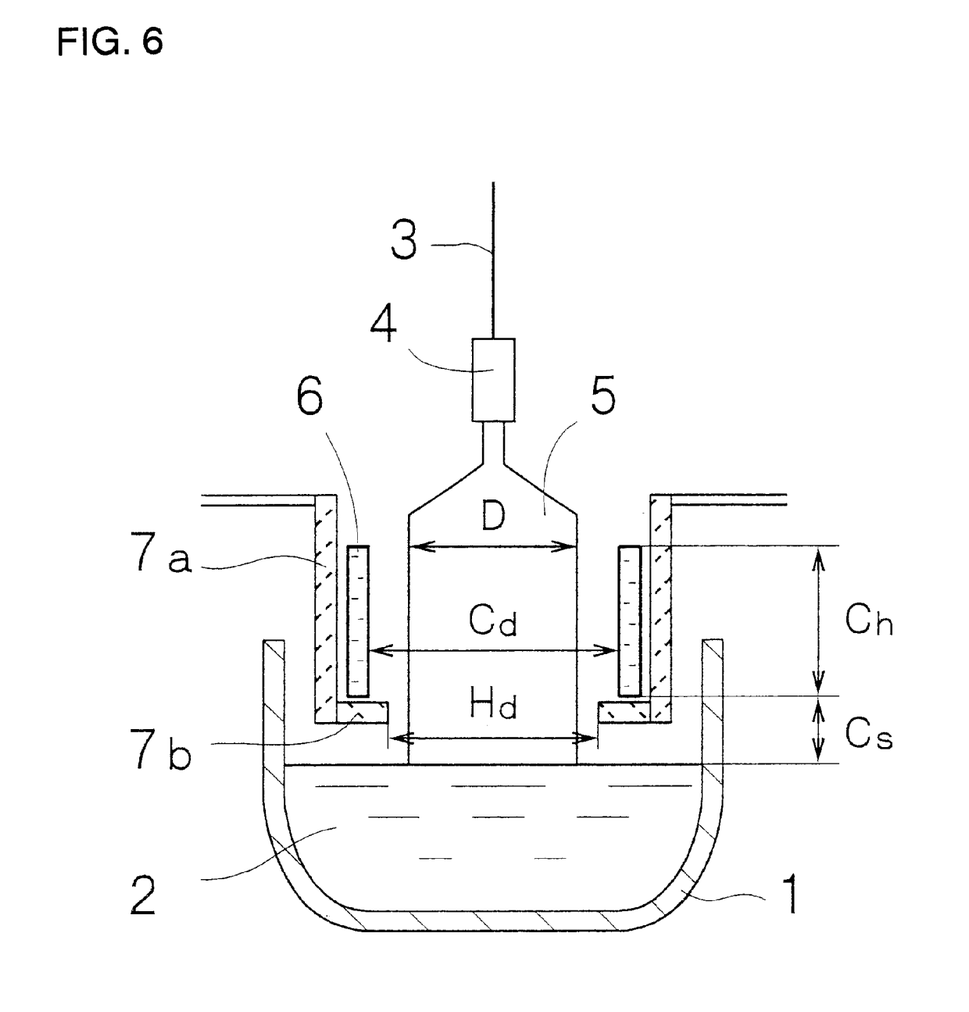
FIG. 6 is a figure schematically showing, as a specific example, a crucible and the surroundings of a single crystal being pulled up in the silicon single crystal production apparatus according to the invention.

Referring to the example schematically shown in FIG. 6, the apparatus of the invention is explained. This figure shows only a crucible 1 of the single crystal pulling apparatus, which contains the silicon melt 2, and the surroundings of a single crystal 5 during pulling up. For pulling up and growing the single crystal 5, the molten silicon as a starting material prepared by melting by means of a heater is placed in the inside of the crucible 1, a seed crystal mounted on a seed chuck 4 of a pulling axis is first brought into contact with the surface of the melt 2, the seed crystal is then pulled up while causing the melt to solidify at the tip thereof, and the single crystal 5 is grown by allowing the solidified portion to grow. The crucible and/or the single crystal to be pulled up may be rotated around the pulling axis, if necessary. During the growth of the single crystal, the convection of the melt may be controlled and/or a horizontal magnetic field or a cusped magnetic field may be applied for attaining stable growth of the whole crystal and making uniform the distribution of a dopant and/or impurity element(s). Such measures are the same as in the case of single crystal pulling apparatus generally employed for carrying out the CZ method.

As shown in FIG. 6, the magnitudes of the diameter D of the single crystal 5, the inside diameter Cd of the cooling member 6, the length Ch thereof, the distance Cs from the surface of the silicon melt 2 to the bottom of the cooling member 6 and the inside diameter Hd of the thermal insulating member 7b below the cooling member are restricted according to the invention, as follows.

(a) Cd: 1.2D to 2.5D;
(b) Ch: ≧0.25D;
(c) Cs: 0.30D to 0.85D;
(d) Hd: <Cd.

The grounds for restriction of these dimensions are described below.

In the apparatus of the invention, the cooling member 6 is disposed around the single crystal 5 to be pulled up. The cooling member 6 is made of a high thermal conductivity metal such as copper, iron, stainless steel or molybdenum and it is desirable that the surface temperature thereof can be maintained at ordinary temperature to about 200° C. by passing cooling water or the like through the inside thereof.

The diameter of the internal surface of the cooling member 6 facing the outer surface of the single crystal 5 should be within the range of 1.20D to 2.50D (D being the diameter of the single crystal to be grown). The reason why the inside diameter of the cooling member 6 and the position of disposition thereof, which is to be mentioned later herein, are selected in proportion to the diameter of the single crystal 5 in that manner is that if the distance between the single crystal surface and cooling member surface remains constant in spite of an increase in single crystal diameter, the crystal surface is cooled excessively and shrinkage due to such cooling may cause generation of such defects as dislocations within the single crystal. Similarly, when the inside diameter of the cooling member 6 is less than 1.20D, hence is too close to the single crystal 5, the crystal surface is cooled excessively, too. If it is in excess of 2.5D, the cooling member is too remote and the cooling effect will become insufficient.

The shape of the internal surface of the cooling member 6 facing the single crystal 5 is a body of rotational symmetry coaxial with the single crystal pulling axis and it may be cylindrical and almost parallel to the outer surface of the single crystal 5 or deformed provided that the inside diameter facing the single crystal 5 is within the range of 1.20D to 2.50D. For example, it may have a funnel-like surface like an inverted truncated cone with the diameter increasing upwards, or a tiered shape with the inside diameter of an upper tier being larger than that of a lower tier. In cases where such deformed or modified shapes are selected, the bottom portion close to the melt surface preferably has the least inside diameter, whereby the temperature distribution shown in FIG. 3(b) or FIG.(5b) can be realized with more ease. A tube wound like a solenoid coil may also be used if the effective cooling diameter is within the range of 1.20D to 2.50D.

The length Ch of the cooling member should be at least 0.25D. This is because, if the length Ch is less than 0.25D, the effects of cooling the surface of the single crystal during growth and realizing the required temperature distribution can no longer be obtained. However, if it is excessively long, the cooling member will no more produce a necessary influence on the temperature distribution at high temperatures within the single crystal just after pulling up. It is thus recommendable that the length Ch of the cooling member 6 be not more than D.

The position of disposition of the cooling member 6 should be such that it is coaxial with the pulling axis and that the distance Cs from the bottom thereof to the melt surface is 0.30D to 0.85D. This is because, if Cs is less than 0.30D, the thermal radiation from the melt surface and crucible inside wall toward the surface of the single crystal just after solidification decreases and the distribution such that the temperature gradient in the surface portion is smaller than in the central portion cannot be obtained. If, conversely, Cs exceeds 0.85D, the central portion of the single crystal just after solidification will be cooled only to an insufficient extent and the above-mentioned effect of making the temperature gradient in the surface portion smaller than in the central portion will decrease, too.

Outside the cooling member 6, there is disposed a thermal insulating member 7a facing the crucible inside wall and, below the bottom of the cooling member 6, there is disposed a thermal insulating member 7b facing the melt surface. This is for the purpose of preventing the cooling effect of the cooling member from extending to unnecessary portions or members in the apparatus to thereby make it easy to attain the required temperature distributions and for the purpose of preventing the cooling member from being heated. The thermal insulating members are made of graphite, carbon felt, a ceramic refractory material or a composite material derived from these, for instance. Their thickness is recommendably about 5 to 40 mm although it may vary depending on the shape of the cooling member, and they may be disposed in contact with or a little apart from the cooling member 6. Where the cooling member 6 is inserted into the crucible, the outside diameter of the thermal insulating member 7a outside the cooling member 6 must be smaller than the inside diameter of the crucible.

The inside diameter Hd of the thermal insulating member 7b disposed below the bottom of the cooling member 6 and facing the melt surface is smaller than the inside diameter Cd of the cooling member. In cases where the inside surface of the cooling member 6 has a deformed or modified shape, Hd should be smaller than the least diameter of that shape. This is for the purpose of preventing the cooling effect of the cooling member from excessively extending to the single crystal surface just after solidification and from thus causing failure to satisfactorily produce the temperature distributions in the single crystal as shown in FIG. 3(b) or FIG. 5(b). The inside diameter Hd of the thermal insulating member 7b is not particularly restricted provided that it is smaller than Cd. Desirably, however, the size is such that the member is at least 10 mm apart from the target outside surface of the single crystal 5 so that the single crystal during being pulled up and growing may not contact therewith in case of deformation of the crystal.

For producing a single crystal using the single crystal production apparatus provided with the above-mentioned cooling member and thermal insulating members and causing the whole single crystal to have a condition very limited in the number of grown-in defects, it is necessary to pull up the single crystal at an optimum rate at which the defect-free region can be enlarged. This optimum rate is strongly influenced by not only by the material, shape and/or structure of the cooling member and thermal insulating members but also by the thermal conditions of the apparatus as a whole. Therefore, it is preferable, for example, to gradually vary the pulling rate of a single crystal during growth thereof, cut the single crystal obtained longitudinally through a plane along the pulling axis, examine the longitudinal section for the distribution of defects, thus select an optimum pulling rate and pull up single crystals at that rate.

EXAMPLE 1

Using an apparatus having the structure schematically shown in FIG. 6, a silicon single crystal 5 with a diameter of 200 mm (D=200 mm) was pulled up. The cooling member 6 used was cylindrical and had a vertical direction length Ch of 150 mm (0.75D) and an inner surface diameter of 350 mm (1.75D). The cooling member 6 was made of stainless steel, had a thickness of 20 mm and was cooled by passing water through the inside thereof. The distance Cs from the melt surface to the bottom of the cooling member 6 was 120 mm (0.60D). The thermal insulating member 7a disposed outside facing the crucible and the thermal insulating member 7b disposed below the bottom of the cooling member each was a 20-mm-thick carbon felt insulator covered with a 7-mm-thick graphite layer. The inside diameter Hd of the thermal insulating member 7b was 260 mm and disposed 30 mm apart from the outside surface of the single crystal to be produced.

The crucible was charged with 120 kg of high-purity polycrystalline silicon and then the p-type dopant B was added so that the single crystal might have an electric resistance of about 10 $\Omega$ cm. The inside of the apparatus was placed in an argon atmosphere under reduced pressure, the silicon was melted by heating, the electric power for heating was then adjusted and a seed crystal was dipped in the melt and pulled up while rotating the crucible and pulling shaft.

A neck section was first formed, then a shoulder section was formed and, after attainment of a diameter of 200 mm, further adjustments were made to establish a stationary state. Upon arrival of a single crystal length of 200 mm, a pulling rate of 1.0 mm/min was employed. Then, the pulling rate was continuously and gradually reduced so that the pulling rate might arrive at 0.4 mm/min upon arrival of a single crystal length of 800 mm. Thereafter, the pulling rate was maintained at 0.4 mm/min until arrival of a length of 1,000 mm, followed by tailing to finish the crystal pulling procedure. The results of heat transfer analysis simulation calculations revealed that the vertical direction temperature gradient in the central portion of single crystal between the melting point to 1,250° C. was 3.9 to 4.1° C./mm and that in the peripheral region was 3.1 to 3.3° C./mm, each thus being almost constant in spite of the fact that the pulling rate was varied.

The single crystal obtained was longitudinally sliced, and a slice specimen in the central portion containing the central pulling axis and having a thickness of about 1.4 mm was taken, immersed in a 16% (by weight) aqueous solution of copper nitrate for deposition of copper and, after 20 minutes of heating at 900° C., observed for the position of the OSF ring and the distributions of respective defective regions by X-ray topography. This slice specimen was also examined for the density of laser scattering tomography defects by laser tomography and for the density of dislocation cluster defects by Secco etching.

Figure 7:
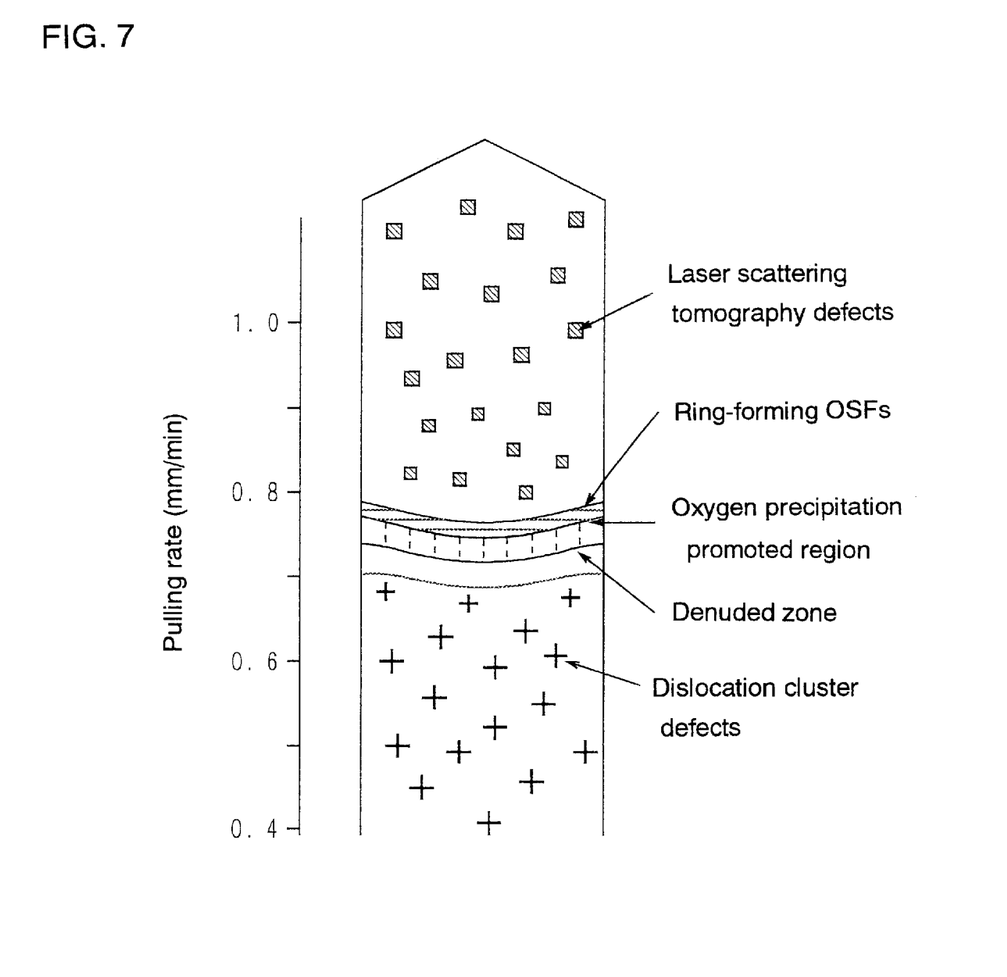
FIG. 7 is a figure schematically illustrating the distribution of defects in a longitudinal section of a single crystal produced by using the apparatus of the invention and continuously varying the pulling rate in a wide range.

The results of defect distribution examination versus the varying pulling rate were as schematically shown in FIG. 7. Comparison with the results of defect distribution examinations in the longitudinal section containing the central axis as obtained by following the conventional method of pulling up single crystals in the same manner by varying the pulling rate and shown in FIG. 2 reveals conversion of the V-shaped distribution of the OSF ring and surrounding denuded and other zones to a nearly horizontal condition. In this case, the OSF ring disappeared when the pulling rate became 0.74 mm/min and dislocation cluster defects appeared when the rate became less than 0.70 mm/min. Thus, it was estimated that the whole single crystal might acquire a condition almost free of grown-in defects by selecting a pulling rate between 0.70 and 0.74 mm/min. If the OSF ring generation region, which is free of grown-in defects, is also included in such selection, single crystals can be pulled up at a rate within the range of 0.70 to 0.77 mm/min.

EXAMPLE 2

Using the same apparatus as used in Example 1, silicon was melted and a single crystal was pulled up in the same manner. In that case, the pulling rate was adjusted to 0.75 mm/min at a single crystal length of 200 mm, and the pulling rate was then gradually reduced so that it might become 0.69 mm/min at a length of 800 mm. At this pulling rate of 0.69 mm/min, the pulling was further continued until 1,000 mm, followed by tailing to finish the pulling procedure.

Figure 8:
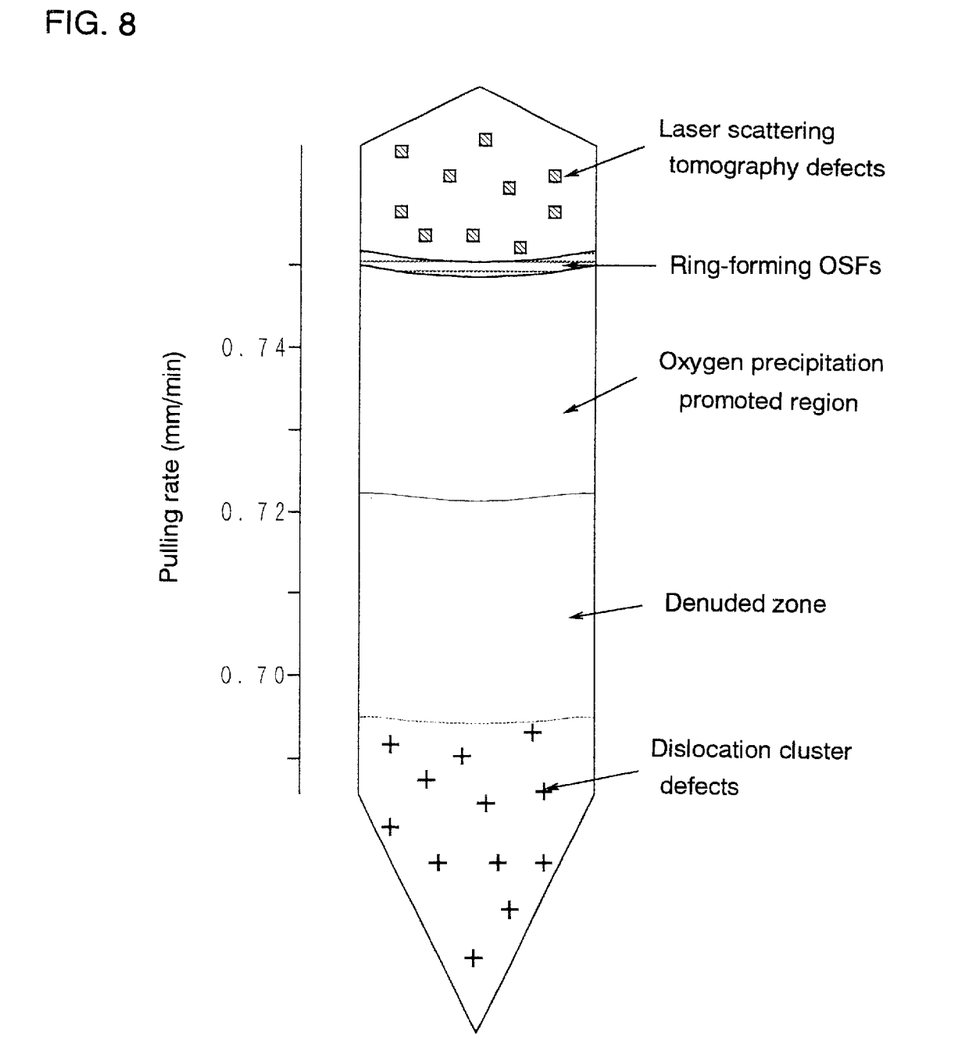
FIG. 8 is a figure schematically showing the distribution of defects in a longitudinal section of a single crystal produced by using the apparatus of the invention and continuously varying the pulling rate in a relatively narrow range.

The single crystal obtained was longitudinally sliced and the distribution of defects was examined in the same manner as in Example 1. The results revealed that a single crystal as shown in FIG. 8 could have been obtained. By keeping the vertical direction temperature gradient in the peripheral region smaller than the vertical direction temperature gradient in the central portion in the single crystal just after solidification in that manner, it is possible for the whole single crystal to have a condition almost free of grown-in defects if the pulling rate is controlled within a specific range. Wafers sliced from this grown-in defect-free region were examined for time-zero dielectric breakdown (TZDB) at an oxide film thickness of 25 nm. As a result, the conforming item percentage per wafer was found to be above 97%.

Industrial Applicability

In pulling up a silicon single crystal, the apparatus according to the invention can make the vertical direction temperature gradient in the peripheral region of the single crystal smaller than in the central portion. By using this apparatus and selecting an appropriate pulling rate, it is possible to readily produce single crystals very limited in the number of grown-in defects and capable of coping with the increasing degree of integration and miniaturization of devices.

What is claimed is:

1. An apparatus for producing silicon single crystals by pulling up the same from the melt which comprises:

a cooling member surrounding the single crystal and having an internal surface coaxial with the pulling axis and thermal insulating members disposed outside the outer surface and below the bottom surface of the cooling member, the cooling member having an internal surface diameter of 1.20D to 2.50D (D being the diameter of the single crystal to be pulled up) and a length of not less than 0.25D, the distance from the melt surface to the bottom surface of the cooling member being 0.30D to 0.85D and the bottom side of the thermal insulating member below the cooling member having an inside diameter smaller than the inside diameter of the bottom of the cooling member, wherein the single crystal, just after pulling up, will show a higher temperature in the peripheral region of the crystal than in the central portion.

2. An apparatus for producing silicon single crystals as claimed in claim 1, wherein the cooling member is of a water-cooled type and made of a high thermal conductivity metal.

3. An apparatus for producing silicon single crystals as claimed in claim 1, wherein the thermal insulating members are made of graphite and carbon felt.

4. An apparatus for producing silicon single crystals by pulling up the same from the melt which comprises:

a cooling member surrounding the single crystal and having an internal surface coaxial with the pulling axis and thermal insulating members disposed outside the outer surface and below the bottom surface of the cooling member, the cooling member having an internal surface diameter of 1.20D to 2.50D (D being the diameter of the single crystal to be pulled up) and a length of not less than 0.25D, the distance from the melt surface to the bottom surface of the cooling member being 0.30D to 0.85D and the bottom side of the thermal insulating member below the cooling member having an inside diameter smaller than the inside diameter of the bottom of the cooling member, wherein the single crystal, just after pulling up, will show a temperature distribution pattern as shown in FIG. 5(*b*).

* * * * *